United States Patent
Tseng et al.

(10) Patent No.: US 11,632,089 B2
(45) Date of Patent: Apr. 18, 2023

(54) NOTCH CIRCUIT AND POWER AMPLIFIER MODULE

(71) Applicant: MEDIATEK Inc., Hsinchu (TW)

(72) Inventors: Wei-Che Tseng, Hsinchu (TW); Chen-Yen Ho, Hsinchu (TW)

(73) Assignee: MEDIATEK INC., Hsinchu (TW)

(*) Notice: Subject to any disclaimer, the term of this patent is extended or adjusted under 35 U.S.C. 154(b) by 230 days.

(21) Appl. No.: 16/878,669

(22) Filed: May 20, 2020

(65) Prior Publication Data

US 2020/0403585 A1 Dec. 24, 2020

Related U.S. Application Data

(60) Provisional application No. 62/863,952, filed on Jun. 20, 2019.

(51) Int. Cl.
*H03F 1/02* (2006.01)
*H03F 3/24* (2006.01)
(Continued)

(52) U.S. Cl.
CPC .......... *H03F 3/245* (2013.01); *H03F 1/0222* (2013.01); *H04B 1/0475* (2013.01); *H04B 1/16* (2013.01);
(Continued)

(58) Field of Classification Search
CPC .. H03F 3/245; H03F 1/0222; H03F 2200/102; H03F 2200/267; H03F 3/195;
(Continued)

(56) References Cited

U.S. PATENT DOCUMENTS

| 6,545,542 B2 | 4/2003 | Matsuyoshi et al. |
| 9,020,451 B2 * | 4/2015 | Khlat .................. H03F 1/0227 |
| | | 455/127.1 |

(Continued)

FOREIGN PATENT DOCUMENTS

| TW | 201840228 A | 11/2018 |
| TW | 201917998 A | 5/2019 |

OTHER PUBLICATIONS

TW Office Action dated Sep. 15, 2020 in Taiwan application (No. 109120197).

*Primary Examiner* — Hafizur Rahman
*Assistant Examiner* — Khiem D Nguyen
(74) *Attorney, Agent, or Firm* — McClure, Qualey & Rodack, LLP

(57) ABSTRACT

A notch circuit and a power amplifier module capable of reducing self-interference in a transceiver are provided. The transceiver includes a transmitter and a receiver, and the transmitter causes self-interference to the receiver. The transmitter includes a power amplifier module and the power amplifier module includes a notch circuit and a power amplifier. The notch circuit includes an inductor and a capacitor. The power amplifier amplifies an input transmission signal to generate an output transmission signal. The inductor receives a supply voltage. An amplitude of the supply voltage varies with the first input transmission signal. The capacitor is electrically connected to the inductor. The first output transmission signal (Tx_out1) is attenuated when a modulated frequency of the supply voltage is corresponding to a stopband.

15 Claims, 3 Drawing Sheets

(51) Int. Cl.
*H04B 1/04* (2006.01)
*H04B 1/16* (2006.01)
*H04B 1/38* (2015.01)

(52) U.S. Cl.
CPC .. *H03F 2200/102* (2013.01); *H03F 2200/267* (2013.01); *H04B 1/38* (2013.01); *H04B 2001/0408* (2013.01)

(58) Field of Classification Search
CPC ........... H03F 3/68; H04B 1/0475; H04B 1/16; H04B 1/38; H04B 2001/0408
USPC ........................................ 330/136, 296, 297
See application file for complete search history.

(56) References Cited

U.S. PATENT DOCUMENTS

| | | |
|---|---|---|
| 9,143,172 B2 | 9/2015 | See et al. |
| 10,230,340 B1 * | 3/2019 | Khlat .................. H03F 3/21 |
| 10,523,120 B2 | 12/2019 | Youn et al. |
| 10,666,200 B2 | 5/2020 | Gebeyehu et al. |

* cited by examiner

NOTCH CIRCUIT AND POWER AMPLIFIER MODULE

This application claims the benefit of U.S. provisional application Ser. No. 62/863,952, filed Jun. 20, 2019, the disclosure of which is incorporated by reference herein in its entirety.

TECHNICAL FIELD

The disclosure relates in general to a notch circuit and a power amplifier module, and more particularly to a notch circuit and a power amplifier module capable of reducing the self-interference in a transceiver.

BACKGROUND

Nowadays, consumer electronic devices are equipped with communication functions, and transceivers are widely used. FIG. 1 is a schematic diagram illustrating a transceiver having a transmitter and a receiver. The transceiver 10 includes a transmitter (Tx) 11 for transmitting output transmission signal Tx_out and a receiver (Rx) 13 for receiving input reception signal Rx_in.

In the current cellular systems, transmit band and receive band are usually closely spaced, such that some of the output transmission signal Tx_out can be received by the receiver 13. The output transmission signal Tx_out causes interference to the receiver 13, and the quality of the input reception signal Rx_in is consequentially degraded. Alternatively speaking, the receiver 13 might suffer from self-interference originated from the transmitter 11. Please refer to FIGS. 1 and 2 together.

FIG. 2 is a schematic spectrum diagram illustrating the self-interference phenomenon. The horizontal axis represents frequency, and the vertical axis represents the strength of signals. Curves L1, L2 represent the output transmission signal Tx_out with two different center frequencies F_txa, F_txb, respectively. The receiver 13 provides a band pass function, and curve L3 represents the receiver band of the receiver 13.

It is assumed that the center frequency F_txa is lower than the center frequency F_txb, and the center frequency F_txb is lower than the center frequency of the receiver band F_rx.

Accordingly, the slope section of the curve L2 is partially overlapped with curve L3. This implies that the output transmission signal Tx_out with the center frequency F_txb has strong strength while it is received by the receiver 13, and it may cause severe self-interference to the receiver 13.

On the other hand, the curve L3 does not cover the slope section of the curve L1 but the flat section of the curve L1. This implies that the output transmission signal Tx_out with the center frequency F_txa has weak strength while it is received by the receiver 13, and it unlikely causes self-interference to the receiver 13.

In FIG. 2, it is assumed that the center frequencies F_txa, F_txb of the output transmission signal Tx_out are lower than the center frequency of the receiver band F_rx. In practical application, the center frequency of the output transmission signal Tx_out might be lower than or higher than the center frequency of the receiver band F_rx. Nevertheless, the self-interference phenomenon exists in both cases.

The center frequency of the output transmission signal Tx_out and the center frequency of the receiver band F_rx are defined by the communication standards (for example, 4G, 5G). However, separating the center frequencies of the output transmission signal Tx_out and the receiver band becomes more and more difficult due to the limited frequency band resources. Thus, the center frequency of the output transmission signal Tx_out and the center frequency of the receiver band F_rx become closer, and the self-interference tends to be an unavoidable phenomenon.

SUMMARY

The disclosure is directed to a notch circuit and a power amplifier module. The notch circuit and the power amplifier module are capable of lowering the side effects caused by the self-interference in a transceiver.

According to one embodiment, a notch circuit is provided. The notch circuit is electrically connected to a first power amplifier. The first power amplifier amplifies a first input transmission signal to generate a first output transmission signal. The notch circuit includes an inductor and a capacitor. The inductor is electrically connected to the first power amplifier. The inductor receives a first supply voltage (Vpa). An amplitude of the first supply voltage (Vpa) varies with the first input transmission signal (Tx_in). The capacitor is electrically connected to the inductor. When a modulated frequency of the first supply voltage (Vpa) is corresponding to a stopband, the first output transmission signal (Tx_out1) is attenuated.

According to another embodiment, a power amplifier module is provided. The power amplifier module includes a power amplifier and a notch circuit. The power amplifier receives a first supply voltage (Vpa). In addition, the power amplifier amplifies a first input transmission signal (Tx_in) to generate a first output transmission signal (Tx_out1) based on the first supply voltage (Vpa). An amplitude of the first supply voltage (Vpa) varies with the first input transmission signal (Tx_in). The notch circuit is electrically connected to the power amplifier. The notch circuit includes an inductor and a capacitor. The inductor is electrically connected to the power amplifier. The inductor receives the first supply voltage (Vpa). The capacitor is electrically connected to the inductor. When a modulated frequency of the first supply voltage (Vpa) is corresponding to a stopband, the first output transmission signal (Tx_out1) is attenuated.

Figure 1:
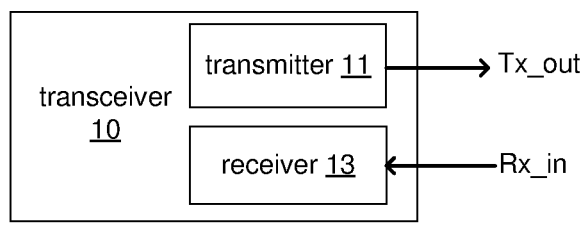
FIG. 1 (prior art) is a schematic diagram illustrating a transceiver having a transmitter and a receiver.
Figure 2:
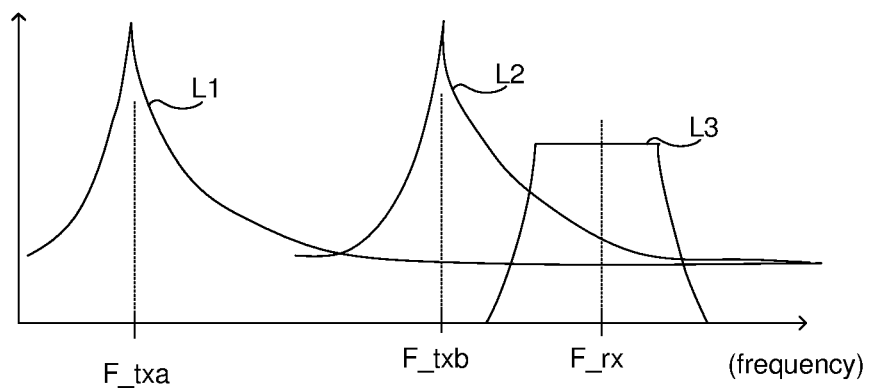
FIG. 2 (prior art) is a schematic spectrum diagram illustrating the self-interference phenomenon.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

As illustrated above, the existence of the self-interference might endanger the operation of the receiver, and the self-interference phenomenon cannot be eliminated by separating center frequencies of the output transmission signal Tx_out and the receiver band. Therefore, a notch circuit and a power amplifier module capable of reducing the side effects caused by the self-interference are provided in the present disclosure.

Figure 3:
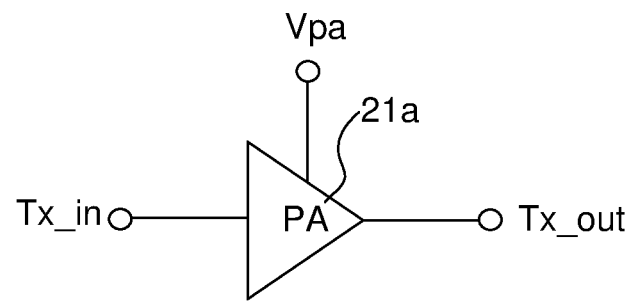
FIG. 3 is a schematic diagram illustrating a power amplifier.

FIG. 3 is a schematic diagram illustrating a power amplifier used at the output stage of the transmitter. The power amplifier 21a receives and amplifies the input transmission signal Tx_in to generate the output transmission signal Tx_out. The power amplifier 21a operates based on a supply voltage Vpa. Nevertheless, the use of the power amplifier results in more self-interferences to the receiver.

Figure 4A:
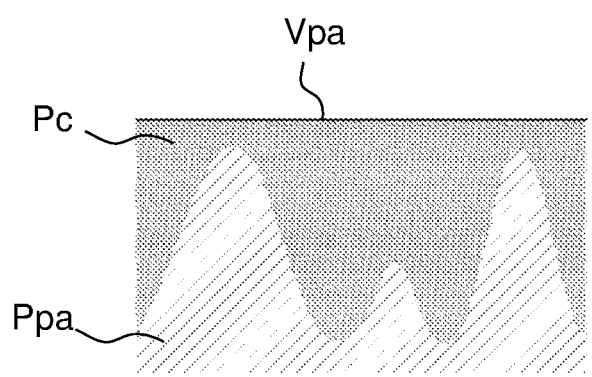
FIG. 4A is a schematic diagram illustrating a power amplifier receiving a constant voltage as its supply voltage.
Figure 4B:
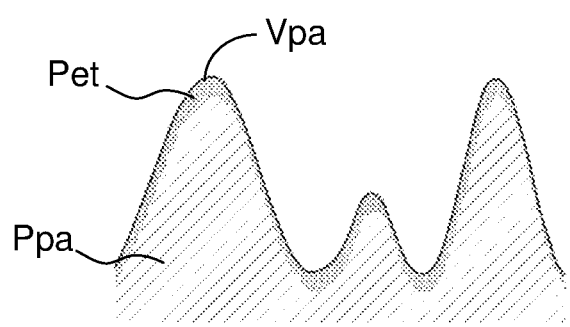
FIG. 4B is a schematic diagram illustrating a power amplifier receiving an envelope tracking signal as its supply voltage.

FIGS. 4A and 4B are schematic diagrams illustrating the power consumption of the power amplifiers corresponding to different types of supply voltages Vpa. In FIG. 4A, the supply voltage Vpa is a constant voltage. In FIG. 4B, the supply voltage Vpa is an envelope tracking signal. That is, the amplitude of the supply voltage Vpa in FIG. 4B varies with the input transmission signal Tx_in.

In FIGS. 4A and 4B, the area shown with oblique lines (area Ppa) represent actual power consumption of the power amplifier 21a, and the areas shown with dotted screentone (area Pc in FIG. 4A, and area Pet in FIG. 4B) represent the power which is provided to but not utilized by the power amplifier 21a. Therefore, the area Pc in FIG. 4A and the area Pet in FIG. 4B imply the unnecessary power loss, or say, the waste power consumption. Apparently, the area Pc in FIG. 4A is greater than the area Pet in FIG. 4B, and the waste power consumption in FIG. 4A is much more than that in FIG. 4B.

As power consumption is the main concern for portable devices, the use of the enveloping tracking signal as the supply voltage Vpa is preferred. However, the use of the enveloping tracking signal might worsen the self-interference phenomenon.

Modern wireless communication standards support numerous frequency bands. Depending on the frequencies, the frequency bands can be classified as the high frequency band, the medium frequency band, and the low frequency band.

When the power amplifier operates in the low frequency band, the separation of the center frequency of the output transmission signal Tx_out and the receiver band is relatively narrow (for example, 40 MHz). When the power amplifier operates in the high frequency band or in the medium frequency band, the separation of the center frequency of the output transmission signal Tx_out and the center frequency of the receiver band is relatively wide (for example, 100 MHz-200 MHz). The wider the frequency separation between the center frequency of the output transmission signal Tx_out and the center frequency of the receiver band, the chance of occurring the self-interference phenomenon is lower. Thus, the self-interference phenomenon in the low frequency band should be especially concerned.

Figure 5:
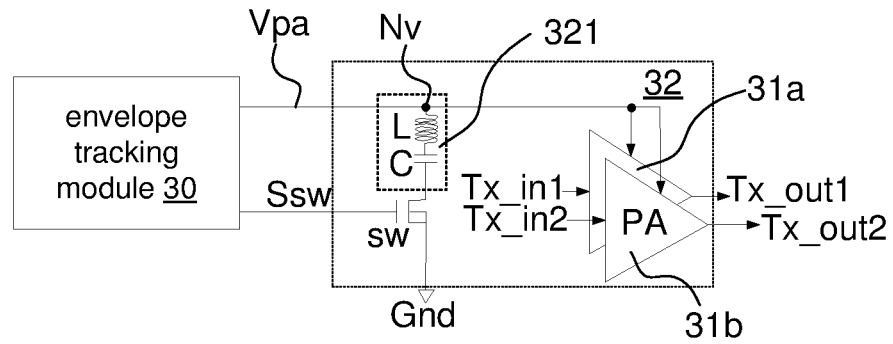
FIG. 5 is a schematic diagram illustrating the power amplifier module according to the embodiment of the present disclosure.

FIG. 5 is a schematic diagram illustrating a power amplifier module used in the output stage of the transmitter according to the embodiment of the present disclosure. The power amplifier module 32 is used together with an envelope tracking module 30, and the envelope tracking module 30 provides an enveloping tracking signal as the supply voltage Vpa. The envelope tracking signal is a modulated signal having a modulated bandwidth. The amplitude of the envelope tracking signal is dynamically adjusted in response to changes in the input transmission signal Tx_in. The power amplifier module 32 receives the supply voltage Vpa and a switch control signal Ssw from the envelope tracking module 30.

The power amplifier module 32 includes amplifiers 31a, 31b, a switch sw, and a notch circuit (band-stop filter or band-rejection filter) 321. When the notch circuit is enabled and when the modulated frequency of the supply voltage (Vpa) is corresponding to a stopband, the output transmission signal (Tx_out) is attenuated. The stopband is corresponding to a frequency band in which self-interference might easily occur. For example, the stopband is between 30 MHz and 60 MHz.

The notch circuit 321 further includes a capacitor C and an inductor L, which are electrically connected in series. The inductor L is electrically connected to a supply voltage terminal Nv and receives the supply voltage Vpa. The capacitor C is electrically connected to the inductor L and the switch sw. Depending on the desired center frequency of the stopband, the capacitance value of the capacitor C and the inductance value of the inductor L can be specially selected/determined.

When the notch circuit 321 is enabled by the switch sw, the output transmission signal Tx_out in most frequencies basically remain unchanged without being altered. Meanwhile, the strength of the output transmission signal Tx_out is attenuated to a very low level when the modulated frequency of the supply is corresponding to the stopband.

As mentioned above, the supply voltage Vpa is an envelope tracking signal having a modulated bandwidth. Therefore, once the notch circuit 321 is enabled and in operation, the supply voltage Vpa is filtered out when a modulated frequency of the supply voltage Vpa is corresponding to the stopband of the notch circuit 321. According to the embodiment of the present disclosure, the stopband of the notch circuit 321 is corresponding to the overlapped frequency range of the output transmission signal Tx_out and the receiver band of the receiver 13.

In the specification, the power amplifier 31a is corresponding to the low frequency band, and the power amplifier 31b is corresponding to the medium frequency band and/or the high frequency band. The power amplifier 31a receives and amplifies the input transmission signal Tx_in1 to generate the output transmission signal Tx_out1. The power amplifier 31b receives and amplifies the input transmission signal Tx_in2 to generate the output transmission signal Tx_out2.

The modulated bandwidth of the supply voltage Vpa is less than a frequency separation corresponding to the low frequency band. The frequency separation corresponding to the low frequency band is defined as the frequency separation between the center frequency of the output transmission signal Tx_out1 and the center frequency of the receiver band corresponding to the low frequency band. Similarly, the modulated bandwidth of the supply voltage Vpa is less than a frequency separation corresponding to the medium frequency band and/or the high frequency band. The frequency separation corresponding to the medium frequency band and/or the high frequency band is defined as the frequency separation between the center frequency of the output transmission signal Tx_out2 and the center frequency of the receiver band corresponding to the medium frequency band and/or the high frequency band. Moreover, the frequency separation corresponding to the low frequency band is less than the frequency separation corresponding to the medium frequency band and/or the high frequency band.

In practical application, the center frequency of the output transmission signal Tx_out1 can be higher or lower than the center frequency of the receiver band corresponding to the low frequency band. In addition, the center frequency of the output transmission signal Tx_out2 can be higher or lower than the center frequency of the receiver band corresponding to the medium frequency band and/or the high frequency band.

According to the embodiment of the present disclosure, the power amplifiers 31a, 31b are selectively and alternatively enabled, depending on the operation mode of the transceiver. The power amplifier 31a is enabled, and the power amplifier 31b is disabled when the transceiver operates in an operation mode in which the low frequency band is selected for wireless communication. On the other hand, the power amplifier 31a is disabled, and the power amplifier 31b is enabled when the transceiver operates in an operation mode in which the medium frequency band and/or the high frequency band is selected for wireless communication.

In practical applications, the number of power amplifiers in the power amplifier module 32 is not limited. For example, in a case that the power amplifier module 32 includes only one power amplifier, the switch sw can be omitted, and the capacitor C is electrically connected to the ground terminal Gnd.

The switch sw is electrically connected to the envelope tracking module 30, the capacitor C, and the ground terminal Gnd. The switch sw is controlled by the switch signal Ssw to selectively enable/disable the notch circuit 321. In the specification, the switch sw is assumed to be an NMOS transistor. Thus, the switch sw is turned on when its gate terminal is at the high voltage level, and vice versa. The implementation of the switch sw and its control mechanism may vary in practical applications.

As illustrated above, the notch circuit 321 is provided to reduce the self-interference, and the self-interference phenomenon is more serious when the transceiver operates in the low frequency band. Therefore, the notch circuit 321 is enabled to reduce the self-interference when the transceiver operates in the low frequency band.

Figure 6:
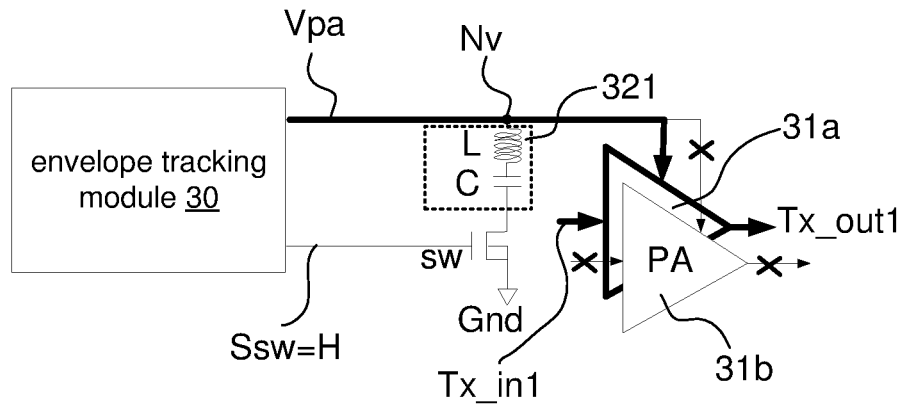
FIG. 6 is a schematic diagram illustrating the operation mode of the power amplifier module according to the embodiment of the present disclosure when the notch circuit is enabled.

FIG. 6 is a schematic diagram illustrating the operation mode of the power amplifier module according to the embodiment of the present disclosure when the notch circuit is enabled. The power amplifier 31a is enabled, and the power amplifier 31b is disabled. Operating based on the supply voltage Vpa, the power amplifier 31a receives and amplifies the input transmission signal Tx_in1 to generate the output transmission signal Tx_out1. The amplitude of the supply voltage Vpa varies with the input transmission signal Tx_in1.

When the transceiver operates in the low frequency band, the switch control signal Ssw is at the high voltage level, and the notch circuit 321 is enabled. With the adoption of the notch circuit 321, the self-interference caused by the output transmission signal Tx_out1 can be dramatically decreased.

Figure 7:
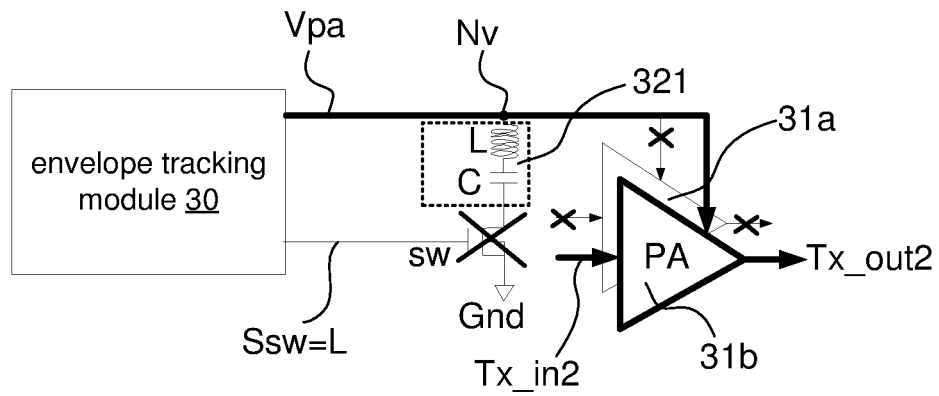
FIG. 7 is a schematic diagram illustrating the operation mode of the power amplifier module according to the embodiment of the present disclosure when the notch circuit is disabled.

FIG. 7 is a schematic diagram illustrating the operation mode of the power amplifier module according to the embodiment of the present disclosure when the notch circuit is disabled. The power amplifier 31b is enabled, and the power amplifier 31a is disabled. Operating based on the supply voltage Vpa, the power amplifier 31b receives and amplifies the input transmission signal Tx_in2 to generate the output transmission signal Tx_out2. The amplitude of the supply voltage Vpa varies with the input transmission signal Tx_in2.

When the transceiver operates in the medium frequency band and/or the high frequency band, the switch control signal Ssw is at the low voltage level, and the notch circuit 321 is disabled. As the self-interference is not serious in the medium frequency band and/or the high frequency band, the notch circuit 321 is disabled in FIG. 7.

The operations and statuses of the components and signals related to the power amplifier module 32 are summarized in the following table.

TABLE

|  | low frequency band | mediate/high frequency band |
|---|---|---|
| frequency separation between center frequency of output transmission signal Tx_out and center frequency of receiver band F_rx | narrow | wide |
| level of self-interference caused by output transmission signal | high | low |
| switch | on | off |
| operation of notch circuit | enabled | disabled |
| figure | FIG. 6 | FIG. 7 |

The physical implementations and positions of the notch circuit 321, the switch sw and the power amplifiers 31a, 31b are not limited. For example, the notch circuit 321, the switch sw, and the power amplifier(s) 31a, 31b can be integrated into the same circuit module or in the same semiconductor die (integrated circuit). Alternatively, the notch circuit, the switch sw, and the power amplifier(s) can be separately placed at the printed circuit board (PCB).

With the power amplifier module, according to the embodiment of the present disclosure, the transceiver can dynamically switch on/off the notch circuit in response to different frequency bands. For the occasions that the self-interference level is relatively high, the notch circuit is enabled to reduce the self-interference. For the occasions that the self-interference level is relatively low, the notch circuit is disabled.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A notch circuit, electrically connected to a first power amplifier being configured for amplifying a first input transmission signal to generate a first output transmission signal, wherein the notch circuit comprises:

an inductor, electrically connected to the first power amplifier, configured for receiving a first supply voltage, wherein an amplitude of the first supply voltage varies with the first input transmission signal; and a capacitor, directly coupled to the inductor and a switch, wherein the first output transmission signal is attenuated when a modulated frequency of the first supply voltage is corresponding to a stopband, and the notch circuit is selectively enabled by the switch, wherein a modulated bandwidth of the first supply voltage is less than a first frequency separation between a center frequency of the first output transmission signal and a center frequency of a first receiver band.

2. The notch circuit according to claim 1, wherein the first supply voltage is provided by an envelope tracking module.

3. The notch circuit according to claim 1, wherein the notch circuit is electrically connected to a second power amplifier.

4. The notch circuit according to claim 3, wherein
the second power amplifier receives and amplifies a second input transmission signal and accordingly generates a second output transmission signal.

5. The notch circuit according to claim 4, wherein
the first output transmission signal is corresponding to a first frequency band, and
the second output transmission signal is corresponding to a second frequency band, wherein the first frequency band is lower than the second frequency band.

6. The notch circuit according to claim 3, wherein
when the notch circuit operates in a first mode, the switch is turned on, the first power amplifier is enabled, and the second power amplifier is disabled; and
when the notch circuit operates in a second mode, the switch is turned off, the first power amplifier is disabled, and the second power amplifier is enabled.

7. The notch circuit according to claim 1, wherein
the center frequency of the first output transmission signal is lower than the center frequency of the first receiver band.

8. The notch circuit according to claim 1, wherein
the center frequency of the first output transmission signal is higher than the center frequency of the first receiver band.

9. The notch circuit according to claim 1, wherein
the first frequency separation is less than a second frequency separation between a center frequency of the second output transmission signal and a center frequency of a second receiver band.

10. The notch circuit according to claim 1, wherein inductance of the inductor and capacitance of the capacitor are related to the stopband, and the stopband is between 30 MHz and 60 MHz.

11. A power amplifier module, comprising:
a power amplifier, configured for receiving a first supply voltage, and amplifying a first input transmission signal to generate a first output transmission signal based on the first supply voltage, wherein an amplitude of the first supply voltage varies with the first input transmission signal;
a notch circuit, electrically connected to the power amplifier, comprising:
an inductor, electrically connected to the power amplifier, configured for receiving the first supply voltage; and
a capacitor, directly coupled to the inductor, wherein the first output transmission signal is attenuated when a modulated frequency of the first supply voltage is corresponding to a stopband, and a modulated bandwidth of the first supply voltage is less than a first frequency separation between a center frequency of the first output transmission signal and a center frequency of a first receiver band; and
a switch, directly coupled to the capacitor and a second supply voltage, configured for selectively enabling the notch circuit.

12. The power amplifier module according to claim 11, wherein the power amplifier module is electrically connected to an envelope tracking module, and the envelope tracking module provides the first supply voltage.

13. The power amplifier module according to claim 11, wherein the notch circuit, the switch and the power amplifier are integrated into an integrated circuit.

14. The power amplifier module according to claim 11, wherein the notch circuit, the switch and the power amplifier are respectively placed on a printed circuit board.

15. The power amplifier module according to claim 11 wherein inductance of the inductor and capacitance of the capacitor are related to the stopband, and the stopband is between 30 MHz and 60 MHz.

* * * * *